United States Patent [19]

Mueller-Hess et al.

[11] Patent Number: 5,126,504

[45] Date of Patent: Jun. 30, 1992

[54] ELECTROPHOTOGRAPHIC COPYING MATERIAL WITH AN ALKALI SOLUBLE POLYURETHANE GRAFT COPOLYMER BINDER

[75] Inventors: Waltraud Mueller-Hess, Wiesbaden; Dieter Mohr, Budenheim; Matthias Kroggel, Kelkheim, all of Fed. Rep. of Germany

[73] Assignee: Hoechst Aktiengesellschaft, Frankfurt am Main, Fed. Rep. of Germany

[21] Appl. No.: 585,936

[22] Filed: Sep. 21, 1990

[30] Foreign Application Priority Data

Sep. 27, 1989 [DE] Fed. Rep. of Germany ....... 3932160

[51] Int. Cl.$^5$ .............................................. G03G 5/05
[52] U.S. Cl. .......................................... 430/96; 430/66; 430/906
[58] Field of Search ............................ 430/96, 906, 66

[56] References Cited

U.S. PATENT DOCUMENTS

| | | | |
|---|---|---|---|
| 3,112,197 | 11/1963 | Neugebauer et al. | 96/1 |
| 3,257,203 | 6/1966 | Neugebauer et al. | 96/1.5 |
| 3,870,516 | 3/1975 | Smith et al. | 96/1.5 |
| 4,066,453 | 1/1978 | Lind et al. | 96/1 R |
| 4,492,747 | 1/1985 | Brechlin | 430/96 |
| 4,525,444 | 6/1985 | Doessel | 430/96 |
| 4,814,246 | 3/1989 | Lehmann et al. | 430/66 |

FOREIGN PATENT DOCUMENTS 944126 12/1963 United Kingdom .

Primary Examiner—Marion E. McCamish
Assistant Examiner—S. Rosasco
Attorney, Agent, or Firm—Foley & Lardner

[57] ABSTRACT

An electrophotographic copying material is disclosed containing, in the photoconductive film, a high-molecular-weight polymer binder which is a graft polymer having a polyurethane as grafting base and grafted-on chains which contain vinyl alcohol units. The material is suitable, in particular, for the production of printing plates and printed circuits which are highly photosensitive and laminatable even at fairly large film thickness. The films can be treated with mild and toxicologically safe stripper solutions.

18 Claims, No Drawings

ELECTROPHOTOGRAPHIC COPYING MATERIAL WITH AN ALKALI SOLUBLE POLYURETHANE GRAFT COPOLYMER BINDER

BACKGROUND OF THE INVENTION

The present invention relates to an electrophotographic copying material composed of an electrically conducting film base suitable, in particular, for producing a printing form or a printed circuit, and of a photoconductive film composed of photoconductor, high-molecular-weight binder which is soluble or dispersible in aqueousalkaline or alcoholic solution, sensitizer and/or activator and standard additives.

It is known to use photoconductive films composed of monomeric or polymeric organic photoconductors, sensitizers and/or activators and also alkali-soluble binders on suitable film bases for the production of printing forms or printed circuits by electrophotographic means. See, e.g., German Patent 1,117,391, corresponding to British Patent 944,126. The photoconductive films are deposited by suitable coating techniques from solution or by lamination, as described, e.g., in German Offenlegungsschrift 3,024,772 corresponding to U.S. Pat. No. 4,492,747, on a metallic or metallized film base. In this case the high-molecular-weight binder contains groups imparting solubility in alkali, such as acid anhydride, carboxyl, phenol, sulfone, sulfonamide or sulfonimide groups (German Patent 2,322,047, corresponding to U.S. Pat. No. 4,066,453). As binders, special mention is made of copolymers of styrene and maleic anhydride, and phenolic resins or of copolymers of styrene, methacrylic acid or acrylic acid and methacrylic acid esters.

To produce a planographic printing form, the electrophotographic copying material is charged electrostatically, exposed or electrostatically charged in accordance with an image and developed with a toner of a dry or liquid developer. The toner image produced is fixed by heating to 100° to 250° C. and the film is then stripped with an aqueous-alkaline or alcoholic solution, as a result of which the points not covered by the toner are dissolved. A mask for a printed circuit is obtained in an analogous way.

In the production of a printed circuit by electrophotographic means by known processes, the disadvantage is that the films containing the binder which impart solubility in alkali can either not be deposited or laminated at all onto a copper-clad circuit board or can be deposited or laminated only at relatively high temperature. The high temperature makes the laminating process difficult and results in damage to the generally thermo-sensitive photoconductor substances, sensitizers and activators. The photoconductive film loses photosensitivity as a result. Another disadvantage is that the films used for the electrophotographic process containing the known alkali-soluble binders are no longer flexible enough in fairly large film thicknesses of about 30 $\mu$m, such as are required for the production of circuit boards. These films have therefore to be handled with extreme care since even a slight bending can result in an undesirable crack formation and the film consequently becomes unusable.

In the production of a printing form or a printed circuit by electrophotographic means, solvents have to be added to the stripper solution to increase the processing rate. These stripper solutions containing solvents have an associated smell which is criticized by some processors since it is troublesome, particularly during the cleaning of the stripping apparatus.

A further disadvantage of the known alkali-soluble binders is the deterioration of the electrophotographic sensitivity which occurs, particularly in the case of large film thickness.

SUMMARY OF THE INVENTION

It is therefore an object of the present invention to provide an electrophotographic copying material for the production of a printing form or of a printed circuit, the photoconductive film of which can be readily laminated and is flexible, has a good charging capability, offers a high sensitivity even in the case of relatively large film thicknesses and is easily and rapidly soluble in an aqueous-alkaline stripper which is as environmentally safe as possible.

In accomplishing these and other objects, there is provided an electrophotographic copying material comprising an electrically conducting film base, and a photoconductive film coated on the base, the film comprising a photoconductor, alkali-soluble graft copolymer binder having a polyurethane as grafting base with grafted-on chains containing vinyl alcohol units.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

An electrophotographic copying material in accordance with the invention contains, as a binder in the photoconductive film, a graft copolymer having a polyurethane as grafting base with grafted-on chains which contain vinyl alcohol units. Preferably, the grafted-on chains also contain free vinyl ester or vinyl acetal units and carboxyl and/or sulfonylurethane groups to increase the alkaline solubility.

The vinyl acetal units are derived from an aliphatic or cycloaliphatic aldehyde. The grafted-on chains may also contain further units of monomers which are ethylenically unsaturated and which can be copolymerized with vinyl esters.

Graft polymers composed of a polyurethane as grafting base and grafted-on vinyl units which are at least partially hydrolyzed to vinyl alcohol units are mentioned in DE 3,732,089. They are used as binders for pigments, for the production of printing inks, of hot melt adhesives, of solvent-containing adhesives, as components of paints or coating agents for fibers, foils and metals, and for thermoplastic molded bodies. German patent application P 3,835,840.9 describes graft copolymers obtained from the above-mentioned graft polymers by acetalation with aldehydes. To prepare them, a carboxylic acid vinyl ester and optionally a further ethylenically unsaturated compound copolymerizable therewith are grafted onto a grafting base composed of a polyurethane and then completely or partially hydrolyzed. The polymers containing vinyl alcohol units obtained in this process can be reacted further with aldehydes to form polyvinyl acetals.

The quantitative proportion of the grafted-on components is generally about 10 to 95, preferably about 30 to 90, and in particular, about 40 to 80, % by weight, based on the total graft polymer.

The polymers used as binders according to the invention contain about 10 to 80 mol percent free hydroxyl groups, about 0 to 65 mol percent acyl groups, about 0 to 85 mol percent acetal groups, about 0 to 40 mol percent carboxyl groups and about 0 to 40 mol percent sulfonylurethane groups. Carboxyl groups are introduced into the graft polymers by reacting free hydroxyl groups with intramolecular anhydrides of organic polycarboxylic acids. The acid anhydride is preferably derived from a di- or tricarboxylic acid, in particular a dicarboxylic acid and may contain one, two or more rings.

Particularly preferred binders are obtained by reaction with acid anhydrides of one of the formulae I, II or III

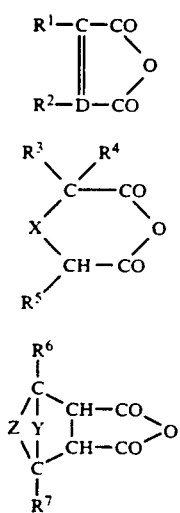

in which

R$^1$ and R$^2$ are individually hydrogen atoms or alkyl groups, or are joined to each other to form an aromatic or heteroaromatic, optionally substituted and optionally partially hydrogenated 5- or 6-membered ring onto which up to two aromatic or cycloaliphatic rings may be fused, R$^3$, R$^4$ and R$^5$ are individually hydrogen atoms or alkyl groups, or R$^3$ and R$^5$ are joined to each other to form an optionally substituted saturated or unsaturated aliphatic ring which may have, including X, five or six ring members, R$^6$ and R$^7$ are hydrogen atoms or alkyl groups, X is a single bond, a 1,1-alkylene group, a 1,1-cycloalkylene group which may optionally be substituted, an oxygen atom or a sulfur atom, Y is an oxygen atom or a sulfur atom, a 1,1-or 1,2-alkylene group or a 1,2-alkylene group on to which an aromatic or cyclo-aliphatic ring is optionally condensed, and Z are the ring members necessary to complete a saturated or unsaturated, optionally substituted ring, it being possible for up to two aromatic or cycloaliphatic rings to be condensed onto the ring.

If R$^1$, R$^2$, R$^3$, R$^4$, R$^5$, R$^6$ or R$^7$ are alkyl groups, they generally have 1 to 4, preferably 1 to 2, carbon atoms. Substituents which may be joined to the aromatic or cycloaliphatic rings are, for example, alkyl groups, alkoxy groups, halogen atoms, nitro groups or carboxyl groups.

Examples of suitable acid anhydrides include:

maleic anhydride and derivatives,
  for example, dimethylmaleic anhydride or citraconic anhydride,
succinic anhydride and derivatives,
  for example, methylsuccinic anhydride, glutaric anhydride and derivatives,
  for example, 3-methylglutaric anhydride, 3,3-tetramethyleneglutaric anhydride or camphoric anhydride,
3-oxaglutaric anhydride and derivatives, phthalic anhydride and substitution products,
  for example, chloro-, nitro- or carboxyphthalic anhydride,
partially or completely hydrogenated phthalic anhydrides,
  for example, hexahydrophthalic anhydride or cyclohexene-1,2-dicarboxylic anhydride,
naphthalene-2,3-dicarboxylic anhydride or naphthalene-1,8-dicarboxylic anhydride and their substitution products,
pyridine-o-dicarboxylic anhydride and its substitution products,
pyrazine-o-dicarboxylic anhydride and its substitution products,
furan-o-dicarboxylic anhydride or furan-2,5-dicarboxylic anhydride, their substitution products and also partially or completely hydrogenated derivatives thereof,
thiophene-o-dicarboxylic anhydride or thiophene-2,5-dicarboxylic anhydride, their substitution products and also completely or partially hydrogenated derivatives thereof,
di- or polycyclic anhydrides produced by Diels-Alder reaction of a diene with maleic anhydride,
  for example, the addition products of furan, anthracene, 1,3-cyclohexadiene or cyclopentadiene and maleic anhydride.

The reaction products with maleic, phthalic, succinic or 3-oxaglutaric anhydride are preferred.

The sulfonylurethane groups are introduced by reaction of free OH groups in the graft polymer with sulfonyl isocyanates of the formula R—SO$_2$—NCO. R may be an alkyl or alkoxy radical containing 1 to 6 carbon atoms, or an aliphatic or cycloaliphatic radical containing at least one olefinic double bond. In the latter case, R generally contains 2 to 12 carbon atoms.

If R is an alkenyl group, it preferably has 2 to 4 carbon atoms; as cycloalkenyl groups, those containing 5 to 8 carbon atoms are preferred. Examples are vinyl, propenyl, allyl, 1-buten-4-yl, 3-cyclohexen-1-yl, 1-cyclohexen-1-yl, methyl-3-cyclohexen-1-yl and more of that kind. Particularly preferred are propenyl and cyclohexenyl radicals.

R may also be a phenyl radical which may be substituted by alkyl radicals containing up to 3 carbon atoms. Particularly preferred is p-toluenesulfonyl isocyanate.

Sulfonylurethane groups are preferably introduced by reaction of a polyvinyl alcohol graft polymer with propenylsulfonyl isocyanate and p-toluenesulfonyl isocyanate. The introduction of the sulfonylurethane and/or carboxyl groups into the graft copolymer may be carried out immediately following the hydrolysis of the carboxylic ester groups of the original graft polymer or after an acetalation.

As binders, fully hydrolyzed derivatives, partially hydrolyzed derivatives and the respective acetalation products containing $C_1$- to $C_{20}$-aldehydes are used; they preferably contain in addition about 2 to 40 mol percent of sulfonylurethane and/or carboxyl groups. Although the introduction of these groups which impart solubility in alkali is preferred, it is not absolutely necessary.

The use according to the invention of the derivatives of polyvinyl alcohol graft polymers as binders in the electrophotographic copying films results in printing forms or printed circuits having advantageous, surprisingly improved properties. The binders used according to the invention are superior to conventional, alkali-developable binders in electrophotographic copying materials because of two structural peculiarities.

The brittleness inherent in the conventional polyvinyl alcohols is considerably suppressed in the graft polymers according to the invention by ether groups in the polymer main chain. These ether groups bring about, in addition, an improved solubility in aqueous-alkaline developer solutions. The increased elasticity of the graft polymers is promoted by the urethane groups also built into the backbone.

The brittleness of the polyvinyl alcohol derivatives grafted onto a polyurethane base is markedly reduced compared with conventional polyvinyl alcohols. Flexible plates are therefore obtained even with film thicknesses of about 30 $\mu$m. The melting points of the polymers can be varied very widely by altering the polyurethane grafting base and also by adjusting the degree of hydrolysis and derivative formation of the OH groups produced.

In the graft polymers used to produce the binders according to the invention, the percentage of the grafted-on components is about 10 to 95, preferably about 30 to 90, in particular about 40 to 80, percent by weight based on the total graft polymer.

The polyurethane grafting bases are composed of polyurethanes containing at least 2 urethane groups in the molecule, the number of urethane groups per grafting base molecule not being subjected to any particular limitation in the upward direction and being capable generally of assuming values higher than 2.

The polyurethanes used as grafting base can be prepared from diols and diisocyanates by standard polyurethane synthesis methods. In principle, all the diols normally used in polyurethane synthesis can be used. Preferred are cycloaliphatic diols, for example, those containing 5-10 carbon atoms such as cyclohexanediols, and also, in particular, aliphatic diols containing 2 to 12 carbon atoms. Also preferred are polyether diols, for example, polypropylene oxides, polybutylene oxides, copolymers of ethylene oxide, propylene oxide, butylene oxide, preferably their block copolymers; particularly preferred are polyethylene oxides, in particular those having molecular weights between about 200 and 10,000, in particular between about 400 and 1500. The polyether diols are advantageously used in combination with low-molecular-weight aliphatic diols, for example, 1,4-butanediol, 1,3-propanediol, ethylene glycol, diethylene glycol, 1,2-hexanediol, pentanediol or cyclohexanediol. Preferably the molar ratio of polyether diol to low-molecular-weight aliphatic diol is about 1:0.1 to 1:0.7.

As diisocyanate components, use is made of aromatic, preferably aliphatic and/or cycloaliphatic diisocyanates. Particularly preferred is the use of 1,6-hexamethylene diisocyanate and/or isophorone diisocyanate.

The molecular ratios of diol to diisocyanate components are preferably between about 1:0.99 and 1:0.5, in particular between about 1:0.89 and 1:0.7. The mean molecular weights of the polyurethanes are preferably between about 200 and 100,000, in particular between about 1000 and 50,000, particularly preferably between about 3000 and 25,000.

For grafting on to the polyurethane grafting bases, vinyl carboxylic acid esters containing about 3 to 20 carbon atoms are preferably used. Preferably, vinyl acetate and/or vinyl propionate are grafted on.

Furthermore, the vinyl carboxylic acid esters can also be grafted on together with other ethylenically unsaturated and copolymerizable monomers such as, for example, maleic acid, itaconic acid, mesaconic acid, crotonic acid, acrylic acid or their esters. The grafting is carried out using grafting catalysts which start radical chains.

The graft polymers can be converted into partially or completely hydrolyzed products by hydrolysis, alcoholysis or transesterification, the degree of hydrolysis being at least about 30, preferably about 45 to 99 mol percent, based on the molar number of hydrolyzable monomer units in the graft polymer.

The graft polymers can be precipitated after removing the residual monomers (usually by azeotropic distillation with methanol) by introducing the mixture into water in its unhydrolyzed form. They may, however, also be converted after dilution with a solvent, preferably with methanol, by means of acid catalysts (for example, hydrochloric acid, phosphoric acid, p-toluenesulfonic acid, etc.) or alternatively and preferably using alkaline catalysts (for example, NaOH, KOH, NaOCH$_3$, KOCH$_3$, etc.), optionally using water, by standard processes known in the literature into partially or completely hydrolyzed products.

Carboxyl or sulfonylurethane groups are introduced into the partially or completely hydrolyzed graft polymers by the reactions already mentioned. On the other hand, the completely or partially hydrolyzed graft polymers may be acetalated even before the introduction of groups increasing the solubility in alkali.

The acetalation of the completely or partially hydrolyzed graft polymers can be carried out by processes known in the literature, preferably in acidic medium. For acetalation, $C_1$- to $C_{20}$-aldehydes, which may be aliphatic, straight-chain or branched and substituted, and aromatic aldehydes, which may also be substituted, are used. Preferably, n-butyraldehyde, isobutyraldehyde, propionaldehyde or formaldehyde, benzaldehyde, p-chlorobenzaldehyde, p-methoxybenzaldehyde and combinations of these aldehydes are used.

The degree of acetalation of the graft polyvinyl acetals is preferably in a range such that the content of nonacetalized polyvinyl alcohol units in the graft polyvinyl acetals is greater than about 15 mol percent, in particular about 18 to 60, and very particularly preferably about 20 to 45 mol percent, based in all cases on the molar content (=100 mol percent) of vinyl alcohol units in the original graft polyvinyl alcohols before the acetalation, it being possible for about 45 mol percent to be in the original, esterified form, in particular, in the form of acetyl or propionyl groups.

Carboxyl and/or sulfonylurethane groups can be introduced into the derivatives of the polyvinyl alcohol graft polymer by reaction of free hydroxyl groups in the polymer with carboxylic acid anhydrides of polybasic acids or sulfonyl isocyanates in any desired and known manner.

The reaction with acid anhydrides may, for example, be carried out in ketones, for example, butanone, tetrahydrofuran, dioxane or N-methylpyrrolidone. Tertiary amines are expediently used as catalysts. Generally about 0.5 to 80 parts by weight of anhydride, about 1000 to 3000 parts by weight of solvent and about 0.5 to 5 parts by weight of tertiary amine are used for 100 parts by weight of polymer containing hydroxyl groups. The reaction can be carried out in solution or in a heterogeneous phase. The following describes a typical reaction in a homogeneous phase.

The completely or partially hydrolyzed and optionally acetalated graft polymers containing hydroxyl groups are first dissolved in a suitable anhydrous solvent, optionally while hot. A basic catalyst, preferably dimethylaminopyridine and/or triethylamine, is added to this solution and the necessary amount of anhydride is added. The mixture is stirred at temperatures between about 50° and 120° C. for about 5 to 10 hours. The cooled solution of the binder is then ready to use and may be used in the specified coating solutions.

For some applications it may be necessary for the polymer to be isolated in solid form. For this purpose, the reaction solution is added dropwise to a larger amount of a suitable nonsolvent, in particular water. The precipitated polymer is filtered off by suction and dried.

In principle, the reaction with sulfonyl isocyanates can be carried out in the same solvents and dispersants as the reaction with carboxylic acid anhydrides. The reaction can be conducted in any desired and known manner. Advantageously, the polymer is dissolved or dispersed in an inert solvent or dispersant and a catalyst added. Tertiary amines or tin compounds such as dibutyltin dilaurate are used as catalysts. The appropriate sulfonyl isocyanate, optionally in dissolved form, is added dropwise to these solutions or dispersions. In this process the reaction mixture heats up from time to time; to complete the reaction, the mixture is heated at temperatures between about 20° and 120° C. for approximately 2 to 24 hours. The completion of the course of the desired reaction is determined by checking the content of free sulfonyl isocyanate. After completion of the reaction, the solution can be used as it is to produce coating solutions; the polymer may, however, also be isolated for particular applications as a solid, for example, by adding the reaction solution dropwise to a nonsolvent. If the reaction is conducted heterogeneously, the polymer is purified by filtration with suction and washing several times with the nonsolvent. If carboxyl- and sulfonylurethane groups are introduced into the polymer, the reaction with the sulfonyl isocyanate is preferably carried out before the reaction with the anhydride. The reactions are carried out in sequence, without intermediate isolation of the polymer.

The electrophotographic copying materials obtained with the binders used according to the invention are notable for a high flexibility and lamination capability, even at high film weights, for an outstanding charging capability and sensitivity, for a high print run and for the easy, aqueous-alkaline strippability. They are used, in particular, to produce electrophotographic printing forms. In such applications, the electrophotographic films generally contain about 80 to 40, preferably about 65 to 50 percent by weight of the binders described above.

On the other hand, binder mixtures can be used, about 10 percent by weight of the graft copolymer according to the invention being present and up to about 90% by weight of the total amount of binder being replaced by a multiplicity of conventional binders. The other polymer binders must also be soluble, dispersible or at least swellable in aqueous-alkaline solutions and be substantially compatible with the graft polyvinyl alcohol derivatives mentioned. This means that a homogeneous mixture suitable for use in electrophotographic copying materials can be prepared from the components.

As conventional binders mention may be made of polyester resins such as copolyesters of iso- and terephthalic acid with glycol. Silicone resins such as three-dimensionally crosslinked phenylmethylsiloxanes or so-called reactive resins such as those known under the designation DD lacquers are also suitable. In addition, copolymers of styrene and maleic anhydride, and also polycarbonate resins, alkyl methacrylate/methacrylic acid copolymers and copolymers of methacrylic acid, higher alkylmethacrylates and methyl methacrylate and/or styrene are suitable.

As film base materials for the photoconductor films, depending on the field of application, metal foils or metal plates, plastic films rendered superficially conductive or plastic films treated specially against the penetration of solvents and rendered conductive are used if an electrophotographic film material is to be produced. If the mixture according to the invention is used in the field of office copying, paper is used as the film base.

If the mixture according to the invention is used in the production of printing forms, metallic film bases, in particular aluminum, are used. The aluminum films used are expediently superficially roughened mechanically or electrochemically and, in special cases, anodized. As film bases for the photoconductive film for producing printed circuits or chemically milled shaped parts, use is made, in particular, of copper-clad epoxy resin boards, copper-clad polyimide films or thin metal foils. The photoconductive film can also be deposited in a laminatable manner on an intermediate polyester film base.

Suitable organic photoconductors are monomeric and polymeric aromatic and heterocyclic compounds. As monomers, use is made particularly of heterocyclic compounds such as oxazole derivatives, e.g., those described in German Patent 1,058,836, corresponding to U.S. Pat. No. 3,189,447. These include, in particular, 2,5-bis(p-diethylaminophenyl)-1,3,4-oxadiazole. Further suitable monomeric photoconducting compounds are, for example, triphenylamine derivatives, more highly condensed aromatic compounds such as anthracene, benzo-condensed heterocyclics, pyrazoline and imidazole derivatives, triazole and also oxazole derivatives such as those disclosed in German Patents 1,060,260 or 1,120,875, corresponding to U.S. Pat. Nos. 3,112,197 or 3,257,203.

Suitable polymeric photoconductors are, for example, vinyl aromatic polymers such as polyvinylanthracene, polyacenaphthylene or copolymers. Poly-N-vinylcarbazole or copolymers of N-vinylcarbazole having an N-vinylcarbazole content of at least about 40% have proved very particularly suitable.

To extend the spectral sensitivity range, it is known to use sensitizers in the photoconductive film. Suitable sensitizing dyes, characterized by the Color Index (C.I.), 3rd edition, 1971, London, from the triarylmethane dye series are, inter alia, brilliant green (C.I. 42040), victoria blue B (C.I. 44045), methyl violet (C.I. 42535), crystal violet (C.I. 42555), acid violet 6BN (C.I. 42552), malachite green (C.I. 42000), fanal blue RM (C.I. 42600), chromoxane pure blue B (C.I. 43830), naphthalene green V (C.I. 44025) and wool-fast blue FGL (C.I. 44505).

Suitable dyes from the xanthene dye series, include rhodamine B (C.I. 45170), rhodamine 6G (C.I. 45,160), sulforhodamine B (C.I. 45,100), eosin B (C.I. 45430), cyanosin (C.I. 45410), rose bengal (C.I. 45440) or fluorescein (C.I. 45350).

Suitable polymethine dyes include astrazon yellow 3G (C.I. 48055), astrazon yellow 5G (C.I. 48065), basic yellow 52,115 (C.I. 48060), astrazon yellow GRL (C.I. basic yellow 29), astrazon yellow 7GLL (C.I. basic yellow 21), astra yellow R (C.I. basic yellow 44), astrazon orange G (C.I. 48035), astrazon orange R (C.I. 48040) and astrazon orange 3R (C.I. basic orange 27).

Thiazine dyes, such as methylene blue (C.I. 52015), acridine dyes, such as acridine yellow (C.I. 46025), acridine orange (C.I. 46005) and trypaflavin, quinoline dyes, quinone and ketone dyes, are also suitable as sensitizing dyes.

Many of these dyes exhibit in the specified form a preexposure sensitivity, i.e., the films sensitized with them can be charged markedly more after storage in the dark for approximately 12 hours than after an exposure, even only a short one. To reduce or to avoid this undesirable property, another dye salt may be used. The pre-exposure sensitivity described can be avoided in the case of cationic dyes, for example, Rhodamine B, if the perchlorate or fluoroborate anion, for example, the tetrafluoroborate anion is introduced instead of the chloride anion by reprecipitation. Further anions are, for example, p-tosyl or the fluorophosphate anion, for example, the hexafluorophosphate, as well as other anions.

All the dyes can be used alone or in mixtures. Activation with electron acceptors is also possible and is described, for example, in German Offenlegungsschrift 2,726,116. Suitable acceptors are nitrofluorenone, trinitrofluorenone, dicyanomethylenefluorene, dicyanomethylenedinitrofluorenone, dicyanomethylenepolynitrofluorenone and 3,6-dinitronaphthalene-1,8-dicarboxylic anhydride.

In addition, sensitization with dispersed photoconductive dye pigments is possible such as is described, for example, in German Offenlegungsschrift 2,108,939 corresponding to U.S. Pat. No. 3,870,516. In this case, inorganic photoconductors such as gaseous selenium, selenium alloys, cadmium sulfide sulfoselenide, zinc oxide or phthalocyanin, which may also contain metal, and other dye pigments such as perylene pigments, for instance N,N'-dimethylperylenetetracarboxylic diimide may also be used. These dispersible dye pigments are preferably used in a concentration of about 0.5 to 2% and result in photoconductive films with pre-exposure sensitivity.

The mixing ratio of the sensitizing dyes to one another is variable and depends, for example, on the light source present in the camera, on the absorption region of the photoconductor used and on the type of the particular sensitizer. The ratio can therefore vary within wide limits. The spectral range, for instance, of the photoconductive film can be matched to the lamp type used in the camera by specific mixing. A photoconductor film of the type which has a higher or rising sensitivity in the shortwave spectral range is advantageous for use with common halogen/tungsten lamps, if allowance is made for the increasing emission of these lamps in the red spectral range.

Although the mixing ratio of the dyes is not critical, sensitizing mixtures containing about 25 to 90 percent by weight, based on the dye mixture, of polymethine dye are generally preferred.

The proportion by weight of sensitizer dye mixture in the photoconductive film may also vary and depends essentially on the desired and required sensitivity. The amount by weight of dye mixture will generally vary between about 0.5 and 0.001%, based on the photoconductor.

The copying material according to the invention may contain leveling agents and plasticizers and/or intermediate film bases and film adhesion promoters as standard additives in the photoconductive film.

Stripping is preferably carried out with aqueous-alkaline stripper solutions. Optionally, the strippers may contain additives which contribute to an accelerated practicable stripping process. As suitable additives for this purpose, mention may be made, in particular, of surfactants. The composition of suitable stripper solutions for the photosensitive films according to the invention depends primarily on the particular application purpose; they should, however, contain more than about 80% of water as a rule.

The examples below are intended to illustrate the invention and its possible applications in more detail. Parts by weight (pbw) and parts by volume (pbv) are in the ratio of g/cm; percentages and quantitative ratios shall be understood to mean parts by weight unless otherwise specified.

EXAMPLE 1

Comparison Example

A conventional polyvinyl butyral (22.6 pbw) having a molecular weight of about 70 to 80,000 and containing 71% vinyl butyral, 2% vinyl acetate and 27% vinyl alcohol units, is dissolved in 170 pbw of anhydrous tetrahydrofuran. A mixture of 5.11 pbw of propenylsulfonyl isocyanate and 30 pbw of tetrahydrofuran is added dropwise to the solution at room temperature in the course of 15 minutes. Stirring of the solution is continued for 4 hours at room temperature. The solution is then added dropwise to 5000 pbw of water, a white fiberless product being obtained which is filtered off by suction and dried to constant weight in vacuo at 40° C. The polymer has an acid value of 144.

A solution is prepared from 4.5 pbw of this polymer 4.5 pbw of a copolymer of styrene and maleic anhydride and 6.0 pbw of 2-vinyl-4-(2,-chlorophenyl)-5-(4'-diethylaminophenyl) oxazole in 45 pbw of ethylene glycol monomethyl ether, 20 pbw of butyl acetate and 70 pbw of tetrahydrofuran. Astrazon orange R (C.I. 48040) (0.1 pbw) and 0.04 pbw of rhodamine B (C.I. 45170) are added to this solution as sensitizers. The solution is deposited on an electrochemically roughened, anodized aluminum foil after-treated with polyvinylphosphonic acid. After the solvent has evaporated, a photoconductor film with a film weight of 5.1 g/m is obtained.

A printing form for offset printing is produced by charging the film to −450 volt in the dark with a corona discharge. It is exposed in a copying camera at aperture 14 for 12 seconds, 10 halogen radiators each having a power of 600 W being used as light source. The latent charge image produced is developed with a dry toner with the aid of a magnetic roller. The toner image is fixed by exposure to heat. The photoconductor film cannot be removed by stripping at the points covered with toner with any of the solutions of the following composition:

Solution a:
  50 pbw of $Na_2SiO_3 \times 9\ H_O$ in 250 pbw of glycerol (86%)
  390 pbw of ethylene glycol, and
  310 pbw of methanol.

Solution b:
  4.0 pbw of 1-amino-2-propanol,
  2.0 pbw of trisodium citrate,
  2.0 pbw of sodium cumenesulfate,
  2.5 pbw of benzyl alcohol, and
  89.5 pbw of water.

Solution c:
  3.0 pbw of triethanolamine,
  1.0 pbw of solid KOH,
  2.0 pbw of polyvinylmethylacetamide,
  2.0 pbw of Graham's salt,
  3.0 pbw of ethylene glycol monophenyl ether,
  4.0 pbw of pelargonic acid, and
  85.0 pbw of water.

EXAMPLE 2

Comparison Example

Fifty pbw of a conventional polyvinyl butyral having a molecular weight of about 70 to 80,000, which contains 71% vinyl butyral, 2% vinyl acetate and 27% vinyl alcohol units, and 4.5 pbw of maleic anhydride are dissolved in 400 pbw of methyl ethyl ketone while heating. One pbw of triethylamine is added to the clear solution and the solution is heated for 5 hours under reflux. After cooling, the solution is filtered and added dropwise to 10,000 pbw of water, a white fiberless product being obtained which is filtered off by suction and dried to constant weight in vacuo at 40° C. The polymer has an acid value of 42.

A solution is prepared from 3.0 pbw of this polymer and 2.0 pbw of 2-phenyl-4-(2,-chlorophenyl)-5-(4'-diethylaminophenyl) oxazole in 18 pbw of ethylene glycol monomethyl ether, 6 pbw of butyl acetate and 28 pbw of tetrahydrofuran. Astrazon yellow 7GLL (C.I. basic yellow 2) (0.2 pbw) and 0.1 pbw of rhodamine FB (C.I. 45170) are added as sensitizers. The solution is deposited with a film thickness of 5 µm on an aluminum foil superficially roughened mechanically by wire brushing. The photoconductor film is negatively charged in the dark to about 450 volt with the aid of a corona. The charged photoconductor film is exposed in a copying camera, the exposure time being 15 seconds if 8 autophoto lamps of 500 W are used. After treatment of the latent charge image produced by the exposure with a commercial toner, a clean, background-free, edge-sharp image of the master, which image is fixed by the action of heat, is obtained. For stripping, the toner-treated photoconductor film is introduced into a cell containing solution a, b or c from Example 1. These photoconductor films cannot be stripped with any of the specified solutions.

EXAMPLE 3

Comparison Example

A printing form with the materials used in Example 1 is produced in a corresponding manner. The only exception is that the 4.5 pbw of the polyvinyl butyral reacted with the propenylsulfonyl isocyanate are replaced by 4.5 pbw of a polymer prepared from the same polyvinyl butyral as in Example 2 but by reaction with 25 pbw of phthalic anhydride instead of with maleic anhydride. The polymer has an acid value of 91.

The points of the printing form not covered with toner cannot be stripped in a standard practical manner with any of the solutions a, b or c from Example 1.

EXAMPLE 4

A printing form is produced with the materials used in Example 3 in a corresponding manner. The only exception is that the 4.5 pbw of the polyvinyl butyral provided with acid groups are replaced by 4.5 pbw of a polymer prepared according to the following description.

Twenty parts by weight of a graft polymer containing 25 percent by weight of urethane groups in the urethane backbone; 69.3 percent by weight of vinyl alcohol units in the graft polymer; and having a degree of hydrolysis of 98.9% and a molecular weight of 22,000, are dissolved in 160 pbw of distilled water while heating gently. N-butyraldehyde (5.8 pbw) and 0.08 pbw of 2,6-di-tert-butyl-4-methylphenol are added at room temperature. A solution of 0.16 pbw of sodium octyl sulfate, 2 pbw of concentrated hydrochloric acid and 24 pbw of water is added dropwise to this mixture while stirring thoroughly. After the mixture has been stirred for one hour at room temperature, it is heated to 40° C. and stirring is continued for a further 2 hours. After adding an additional 5.7 pbw of concentrated hydrochloric acid, stirring is carried out for another two hours at 40° C. and, after cooling to room temperature, the aqueous phase is decanted from the precipitated polymer, the polymer is dissolved in alcohol, precipitated from 10,000 pbw of distilled water and dried in a vacuum drying oven to constant weight. Twenty pbw of the polymer prepared in this way are dissolved in 5.0 pbw of N-methylpyrrolidone, and 13.3 pbw of phthalic anhydride and 0.5 pbw of triethylamine are added. This solution is stirred for 6 hours at 80° C. After cooling to room temperature, the polymer is precipitated from water and dried. It has an acid value of 87.

The points not covered with toner can be removed from the printing form produced analogously to Example 1 (charging to −550 volt, exposure 10 seconds at aperture 14) with all the solutions specified in Example 1, even with the very mild solutions b and c. Despite the low acid value of the binder used according to the invention, very mild and toxicologically harmless stripper solutions can consequently be used.

EXAMPLE 5

Instead of the binder used in Example 1, 4.5 pbw of a different polymer are used. Ten pbw of a graft polymer containing 13.1 percent by weight of urethane groups in the urethane backbone; 58.4 percent by weight of vinyl alcohol units in the graft polymer; and having a degree of hydrolysis of 98.4% and a molecular weight of 44,000, are acetalized analogously to Example 4, but with 7.8 pbw of n-butyraldehyde. After dissolution in methyl ethyl ketone, precipitation from water and subsequent drying, 12 pbw of the polymer thus obtained and 1.3 pbw of phthalic anhydride are dissolved in 100 pbv of methyl ethyl ketone. Triethylamine (0.7 pbv) is added to the clear solution and the solution is heated for 5 hours at 80° C. After precipitation from water and drying, it is used as a binder in accordance with Example 2. Although the acid value of the binder is only 25, the photoconductor film not covered with toner can be removed with solution c from Example 1.

EXAMPLE 6

A further binder is prepared from a polyvinyl alcohol containing 14.2 percent by weight of urethane groups in the urethane backbone; 58.9 percent by weight of vinyl alcohol units in the graft polymer; and having a degree of hydrolysis of 98.0% and a molecular weight of 47,000. Fifty pbw of this polymer are acetalized with n-butyraldehyde in an analogous manner to the procedure cited in Example 4, with the result that the polymer contains 45.9 percent by weight of butyral units.

This binder is processed analogously to Example 4. The toner-free points of the printing form can be removed with solution c specified in Example 1, even though the binder added has an acid value of 0.

EXAMPLE 7

A binder is prepared from a graft polymer of the composition from Example 4 by acetalating 10 pbw of a graft polymer with 3.9 pbw of n-butyraldehyde in accordance with the procedure in Example 4. The re-precipitated and dried acetal is taken up in 80 pbv of methyl ethyl ketone, and 3.3 pbw of o-toluenesulfonyl isocyanate in 10 pbv of methyl ethyl ketone are added dropwise at room temperature. Two drops of dibutyltin dilaurate are added as catalyst. The solution is stirred for two hours at room temperature and for four hours at 60° C. The dried polymer precipitated from water has an acid value of 51.

A printing form is produced in accordance with Example 2. Three pbw of the polymer described above are used as binder. The points not covered with toner are removed from this printing form with solutions a and c specified in Example 1 without difficulty.

EXAMPLE 8

A binder is prepared from a graft polymer of the composition analogous to Example 6 by a reaction sequence analogous to Example 4. The only exception is that instead of 13.3 pbw of phthalic anhydride, 16.0 pbw are used. The dried polymer precipitated from water has an acid value of 39.

A printing form is produced with the materials used in Example 1 in a corresponding manner. The 4.5 pbw of the polyvinyl butyraldehyde derivative are replaced by 4.5 pbw of the above polymer. The points of the printing form not covered with toner can be removed with all three solutions a, b and c from Example 1 without difficulty.

EXAMPLE 9

A binder is produced analogously to Example 4, except that 7.8 pbw of n-butyraldehyde and 4.5 pbw of phthalic anhydride are used for the synthesis. The precipitated and dried polymer has an acid value of 42.

A printing form is produced with the materials used in Example 2, the 3.0 pbw of the polyvinyl butyral containing acid groups used in that case being replaced by the above graft polymer. Although both binders have an acid value of 42, the image-exposed plates differ considerably in the strippability of the toner-free points. The printing form produced in this case can be stripped with solutions a, b and c cited in Example 1, while the films from Example 2 cannot be removed with any of these solutions.

EXAMPLE 10

A binder is synthesized analogously to Example 4. N-butyraldehyde (7.5 pbw) and 4.4 pbw of maleic anhydride are used for the reactions. The precipitated and dried polymer has an acid value of 65.

This polymer is used in a coating solution analogously to Example 1 instead of the polyvinyl butyral. The photoconductor film can be stripped from the toner-free points of the printing form produced with this solution using the solutions a and c.

EXAMPLE 11

A binder having the acid value 58 is synthesized analogously to Example 4, but with 4.5 pbw of succinic anhydride.

An amount of 4.5 pbw this polymer is incorporated in the formulation of Example 1 instead of the polyvinyl butyral used in that case. The toner-free photoconductor film of the printing form produced in accordance with Example 1 can be removed from the base with solutions a, b and c from Example 1.

EXAMPLE 12

Comparison Example

A 50 $\mu$m thick polyethylene terephthalate film - is coated with a solution of 8 pbw of 2,5-bis 4'-N,N-diethylaminophenl)-1,3,4-oxadiazole, 12 pbw of a copolymer of styrene and maleic anhydride, 0.10 pbw of astrazon orange G (C.I. 48035) and 0.05 pbw of brilliant green (C.I. 2040) in 52 pbw of tetrahydrofuran. A dry film thickness of 30 $\mu$m is obtained. The film is very brittle and exhibits marked cracks even if the base film is bent only slightly. If the film is bent around a cylinder having a radius of 15 cm, it begins to peel off. The photoconductive film cannot be laminated. The material is not usable for producing a circuit board resist.

EXAMPLE 13

Comparison Example

A polyethylene terephthalate film is coated in accordance with Example 12, but with a terpolymer composed of 30% methacrylic acid, 10% styrene and 60% methacrylic acid ester as binder. This film also proves to be very brittle and begins to peel off even during drying of the base film. The material cannot be used for a flexible electrophotographic circuit board resist.

EXAMPLE 14

A polyethylene terephthalate film is coated in accordance with Example 12, with the exception that a binder produced from a graft polyvinyl alcohol by acetalation in an analogous manner to Example 4 is used instead of the copolymer. The graft polyvinyl alcohol contains 25 percent by weight of urethane groups in the urethane backbone; 52.7 percent by weight of vinyl alcohol units in the graft polymer; and has a degree of hydrolysis of 98.9% and a molecular weight of 14,000. The film is very flexible and can be bent round a cylinder having a radius of 1 cm without exhibiting cracks. To produce a printed circuit the material is transferred by lamination at a temperature of 95° C. from an intermediate base to a copper-clad epoxy resin board.

EXAMPLE 15

A polyester film is coated in accordance with Example 12. However, the binder used is a polymer prepared in accordance with Example 4 by acetalation of 10 pbw of a graft polyvinyl alcohol with 3.6 pbw of n-butyraldehyde. The graft polyvinyl alcohol contains 25.0 percent by weight of urethane groups in the polymer backbone; 52.7 percent by weight of vinyl alcohol units in the graft polymer; has a degree of hydrolysis of 98.9% and a molecular weight of 28,571. Following the acetalation, the precipitated polymer is dissolved in 50 pbv of methyl ethyl ketone and a solution of 3.2 pbw of propenylsulfonyl isocyanate in 15 pbv of methyl ethyl ketone is added dropwise. After stirring for 1.5 hours at room temperature, the polymer is precipitated from water. It has an acid value of 63. The coated film is very flexible and, like the film from Example 14, can be bent round a cylinder and laminated onto a copper-clad epoxy resin board. The photoconductive copying material, which is very photosensitive in spite of the high film thickness, is exposed in the dark to an image, treated with toner, and the toner, which is attached in accordance with the image, is fixed by heat radiation. In a subsequent process step, the parts of the photoconductive film not covered with toner are dissolved away by treatment with the aqueous-alkaline stripper from Example 1, solution c, down to the copper layer. This stripping proceeds particularly easily with the binder according to the invention. The subsequent process steps (electroplating, tinning, stripping, etching) are carried out as is normal in circuit board technology and result in a qualitatively high-grade circuit board.

EXAMPLE 16

A binder is prepared analogously to Example 7. However, 7.8 pbw of n-butyraldehyde and 8.1 pbw of propenylsulfonyl isocyanate are used for the synthesis. The precipitated and dried polymer has an acid value of 63.

A printing form is produced with the materials used in Example 2, the 3.0 pbw of the polyvinyl butyral-containing acid groups used in that case being replaced by the above graft polymer. The photoconductor film can be removed with solutions a, b and c from Example 1.

EXAMPLE 17

A binder having a OH value of 530 is prepared from 10 pbw of the graft vinyl alcohol used in Example 2 by acetalation in a manner analogous to the procedure in Example 4 with a mixture of 10 pbw of 3-hydroxypentanal and 2.7 pbw of isobutyraldehyde. A coating solution in which the binders are replaced by a mixture of 2.25 pbw of the above polymer and 6.75 pbw of a copolymer of styrene and maleic anhydride is made up in an analogous manner to Example 1. This solution is deposited on the base from Example 1 such that a dry film weight of 5.5 g/m² is obtained. After charging the film and exposing it, the latent charge image produced is developed with a liquid developer as described in French Patent 7,414,841, corresponding to British Patent 1,465,962. For this purpose, 1.5 g of a high-vacuum bitumen having a softening point of 130°-140° C. is dispersed in a solution of 6.5 g of a pentaerythritol resin ester in 1000 pbv of an isoparaffin with a boiling range between 185° and 210° C. After development, the photoconductor film is removed at the image-free points with solution c from Example 1.

EXAMPLE 18

Coating solutions are prepared from 45 pbw of the polymers listed in Table 1, 45 pbw of a copolymer of styrene and maleic anhydride, 60 pbw of 2-phenyl-4-(2'-chlorophenyl)-5-(4'-diethylaminophenyl) oxazole, 0.8 pbw of astrazon orange G (C.I. 48035) and 0.3 pbw of rhodamine FB (C.I. 45170) in 200 pbw of butyl acetate, 700 pbw of tetrahydrofuran and 450 pbw of ethylene glycol monomethyl ether and deposited on an electrochemically roughened anodized aluminum base treated with polyvinylphosphonic acid such that a dry film weight of 5.5 g/m² is obtained. The plates are charged to a surface potential of approximately −550 volt with a corona. After the corona is switched off, the plate remains in the dark for 60 seconds. The percentage drop in potential observed (based on the original potential) is specified as the dark discharge. The bright discharge is specified as the energy $E_{1/8}$ which is necessary to discharge the photoconductor film to one eighth of the original potential. It is calculated as the product of the time after which the charge has dropped to one eighth and the light intensity I of the lamp with which the sample is exposed (Xenophot HLX, incandescent filament lamp supplied by Osram).

TABLE 1

| No. | Polymer from Example No. | Dark discharge in % after 60 seconds | Bright discharge, $E_1$ (J/cm²) |
|---|---|---|---|
| 1 | 1 V | 21 | 158 |
| 2 | 2 V | 19 | 156 |
| 3 | 3 V | 26 | 147 |
| 4 | 4 | 23 | 142 |
| 5 | 6 | 16 | 139 |
| 6 | 8 | 21 | 140 |
| 7 | 9 | 18 | 153 |
| 8 | 11 | 18 | 152 |
| 9 | Copolymer V, styrene/maleic anhydride | 22 | 175 |

The binders according to the invention clearly promote charge transport through the electrophotographic film during exposure, with the dark discharge also being low.

EXAMPLE 19

The materials from Example 8 are used and a printing form is produced with them, with the difference that the dry film weight is only 3 g/m². The material is charged in the dark to −550 volt, exposed to an image, treated with toner and the toner is fixed at the image points by exposure to heat. Despite the low film thickness, a high-contrast toner image with good coverage is obtained. In the subsequent process step, the parts of the photoconductive film not covered with toner are completely dissolved by treatment with solution c from Example 1.

What is claimed is:
1. An electrophotographic copying material comprising:
   an electrically conducting film base; and
   a photoconductive film coated on said base, said film comprising a photoconductor and an alkali-soluble graft copolymer binder having a polyurethane as grafting base with grafted-on chains containing vinyl alcohol units.

2. The copying material as claimed in claim 1, wherein the grafted-on chains comprise vinyl ester units.

3. The copying material as claimed in claim 1, wherein the grafted-on chains comprise vinyl acetal units.

4. The copying material as claimed in claim 3, wherein the vinyl acetal units are derived from an aliphatic or cycloaliphatic aldehyde.

5. The copying material as claimed in claim 1, wherein the grafted-on chains comprise further units of monomers which are ethylenically unsaturated and which can be copolymerized with vinyl esters.

6. The copying material as claimed in claim 1, wherein the grafted-on chains contain carboxyl groups.

7. The copying material as claimed in claim 1, wherein the grafted-on chains contain sulfonylurethane groups.

8. The copying material as claimed in claim 1, wherein the polyurethane is a polyaddition product of diisocyanates and diols.

9. The copying material as claimed in claim 8, wherein an aliphatic diol containing 2 to 12 carbon atoms, a cycloaliphatic diol containing 5 to 10 carbon atoms or an aliphatic polydiol having a molecular weight of about 200 to 10,000 is used as diol.

10. The copying material as claimed in claim 9, wherein a mixture of about 1 mol of polydiol and about 0.1 to 0.7 mol of low-molecular-weight aliphatic diol is used as diol.

11. The copying material as claimed in claim 8, wherein the diisocyanate is an aliphatic diisocyanate containing 4 to 15 carbon atoms or a cycloaliphatic diisocyanate containing 7 to 15 carbon atoms.

12. The copying material as claimed in claim 1, wherein the binder contains about 10 to 80 mol percent of free hydroxyl groups, about 1 to 65 mol percent of acyl groups, about 0 to 85 mol percent of acetal groups, about 0 to 40 mol percent of carboxyl groups and about 0 to 40 mol percent of sulfonylurethane groups.

13. The copying material as claimed in claim 1, comprising about 80 to 40 percent by weight of graft copolymer as binder in the photoconductive film.

14. The copying material as claimed in claim 1, wherein a binder mixture composed of up to about 10 percent by weight of graft copolymer is present in the photoconductive film.

15. The copying material as claimed in claim 1, comprising at least one organic photoconductor.

16. The copying material as claimed in claim 1, comprising at least one sensitizing dye.

17. The copying material as claimed in claim 1, comprising at least one activator.

18. A electrophotographic copying material comprising:
   an electrically conducting film base,; and
   a photoconductive film coated on said base, said film consisting essentially of a photoconductor and an alkali-soluble graft copolymer binder having a polyurethane as grafting base with grafted-on chains containing vinyl alcohol units.

* * * * *